(12) United States Patent
Kawakita et al.

(10) Patent No.: US 10,965,094 B2
(45) Date of Patent: Mar. 30, 2021

(54) WAVELENGTH-TUNABLE LASER DEVICE

(71) Applicant: FURUKAWA ELECTRIC CO., LTD., Tokyo (JP)

(72) Inventors: Yasumasa Kawakita, Tokyo (JP); Kazuaki Kiyota, Tokyo (JP); Yasutaka Higa, Tokyo (JP)

(73) Assignee: FURUKAWA ELECTRIC CO., LTD., Tokyo (JP)

( * ) Notice: Subject to any disclaimer, the term of this patent is extended or adjusted under 35 U.S.C. 154(b) by 3 days.

(21) Appl. No.: 16/533,317

(22) Filed: Aug. 6, 2019

(65) Prior Publication Data

US 2019/0363505 A1    Nov. 28, 2019

Related U.S. Application Data

(63) Continuation of application No. PCT/JP2017/004589, filed on Feb. 8, 2017.

(51) Int. Cl.
*H01S 3/13* (2006.01)
*H01S 5/227* (2006.01)
*H01S 5/343* (2006.01)

(52) U.S. Cl.
CPC ............ *H01S 3/1305* (2013.01); *H01S 5/227* (2013.01); *H01S 5/3434* (2013.01)

(58) Field of Classification Search
CPC . H01S 5/227; H01S 5/343; H01S 3/13; H01S 5/0261; H01S 5/142
(Continued)

(56) References Cited

U.S. PATENT DOCUMENTS 6,240,109 B1 * 5/2001 Shieh .................... H01S 5/0687
                                                            372/18
6,665,321 B1   12/2003 Sochava et al.
(Continued)

FOREIGN PATENT DOCUMENTS

CN   101114755 A   1/2008
CN   102738702 A   10/2012
(Continued)

OTHER PUBLICATIONS

Combined Chinese Office Action and Search Report dated Jun. 19, 2020 in Patent Application No. 201780084262.2 (with English language machine translation), 13 pages.
(Continued)

*Primary Examiner* — Tuan N Nguyen
(74) *Attorney, Agent, or Firm* — Oblon, McClelland, Maier & Neustadt, L.L.P.

(57) ABSTRACT

A laser device includes a wavelength-tunable laser including plural wavelength selectors in an optical resonator; a semiconductor optical amplifier that amplifies the laser light input thereto; a light intensity variation detector that detects variation in intensity of the laser light output from the wavelength-tunable laser before the laser light is input to the semiconductor optical amplifier; a wavelength dithering generation unit that generates a resonator mode wavelength dithering to modulate a resonator mode of the resonator; a wavelength dithering feedback controller that performs, on the resonator mode wavelength dithering, feedback control based on the variation in intensity detected by the light intensity variation detector; a light intensity detector that detects an intensity of the laser light output from the semiconductor optical amplifier; and a semiconductor optical amplifier feedback controller that performs feedback
(Continued)

control on the semiconductor optical amplifier based on the intensity detected by the light intensity detector.

13 Claims, 5 Drawing Sheets

(58) Field of Classification Search
USPC .......................................................... 372/20
See application file for complete search history.

(56) References Cited

U.S. PATENT DOCUMENTS

| | | | |
|---|---|---|---|
| 9,203,212 B2* | 12/2015 | Kurobe | ................... H01S 3/137 |
| 10,193,305 B2 | 1/2019 | Kawakita et al. | |
| 2003/0174743 A1* | 9/2003 | Cliche | ................... H04B 10/504 |
| | | | 372/20 |
| 2004/0188600 A1 | 9/2004 | Chapman | |
| 2008/0025358 A1 | 1/2008 | Arahira | |
| 2011/0013654 A1 | 1/2011 | Yamazaki | |
| 2015/0103853 A1 | 4/2015 | Kurobe et al. | |

FOREIGN PATENT DOCUMENTS

| | | |
|---|---|---|
| CN | 204258035 U | 4/2015 |
| JP | 2009-146952 A | 7/2009 |
| JP | 2011-159752 A | 8/2011 |
| JP | 5567226 B2 | 8/2014 |
| WO | WO 2009/119284 A1 | 10/2009 |
| WO | WO 2016/152274 A1 | 9/2016 |

OTHER PUBLICATIONS

International Search Report dated Mar. 14, 2017 in PCT/JP2017/004589 filed Feb. 8, 2017 (with English Translation).
Written Opinion dated Mar. 14, 2017 in PCT/JP2017/004589 filed Feb. 8, 2017.
Naoki Kobayashi, et al., "Silicon Photonic Hybrid Ring-Filter External Cavity Wavelength Tunable Lasers", Journal of Lightwave Technology, vol. 33, No. 6, Mar. 15, 2015, pp. 1241-1246.
Office Action dated Oct. 27, 2020, in Japanese Patent Application No. 2018-566689 (with English-language translation).
Office Action dated Feb. 2, 2021, in Japanese Patent Application No. 2018-566689 (with English-language translation).

* cited by examiner

WAVELENGTH-TUNABLE LASER DEVICE

CROSS-REFERENCE TO RELATED APPLICATION(S)

This application is a continuation of International Application No. PCT/JP2017/004589, filed on Feb. 8, 2017, the entire contents of which are incorporated herein by reference.

BACKGROUND

The present disclosure relates to a wavelength-tunable laser device.

A widespread use of coherent communication leads to an increasing demand for narrow-linewidth wavelength-tunable lasers. In general, in order to narrow the line width of a semiconductor laser, it is necessary to increase the length of the optical resonator (see U.S. Pat. No. 6,665,321, International Publication No. WO 2016/152274, and N. Kobayashi et al., "Silicon Photonic Hybrid Ring-Filter External Cavity Wavelength Tunable Lasers", J. Lightwave Technol., vol. 33, pp.1241-1246, 2015). A wavelength-tunable laser configured to amplify laser light output from a semiconductor laser with a semiconductor optical amplifier and output the amplified laser light is also disclosed (see Japanese Patent Publication No. 5567226).

In a semiconductor laser including a long optical resonator, the channel spacing (optical frequency spacing) of a resonator mode (longitudinal mode) is narrow and thus it may be difficult to realize stable single-mode emission. In a wavelength-tunable laser configured to amplify laser light output from a semiconductor laser with a semiconductor optical amplifier and output the amplified laser light, it may be difficult to accurately control the wavelength of laser light.

SUMMARY

According to an aspect of the present disclosure, a wavelength-tunable laser device is provided which includes a wavelength-tunable laser element including a plurality of wavelength selection elements in an optical resonator, wherein a wavelength response spectrum of at least one of the wavelength selection elements is variable; a semiconductor optical amplifier configured to receive laser light output from the wavelength-tunable laser element and amplify the received laser light; an optical isolator arranged between the wavelength-tunable laser element and the semiconductor optical amplifier; a light intensity variation detector configured to detect variation in intensity of the laser light output from the wavelength-tunable laser element before the laser light is input to the semiconductor optical amplifier; a wavelength dithering generation unit that generates a resonator mode wavelength dithering to modulate a resonator mode of the optical resonator on a wavelength axis; a wavelength dithering feedback control unit that performs, on the resonator mode wavelength dithering, feedback control in accordance with the variation in intensity that is detected by the light intensity variation detector; a light intensity detector that detects an intensity of the laser light output from the semiconductor optical amplifier; and a semiconductor optical amplifier feedback control unit that performs feedback control on the semiconductor optical amplifier in accordance with the intensity that is detected by the light intensity detector. The semiconductor optical amplifier feedback control unit controls the semiconductor optical amplifier such that an output power of the semiconductor optical amplifier is kept constant, and the variation in intensity of the laser light is detected, before the laser light is input to the semiconductor optical amplifier, by the light intensity variation detector such that the variation in intensity is not attenuated by the resonator mode wavelength dithering generated by the wavelength dithering generation unit.

The above and other objects, features, advantages and technical and industrial significance of this disclosure will be better understood by reading the following detailed description of presently preferred embodiments of the disclosure, when considered in connection with the accompanying drawings.

BRIEF DESCRIPTION OF THE DRAWINGS

FIG. 4 is a diagram of the first comb-like reflectance spectrum, the second comb-like reflectance spectrum, and overlapping in between;

DETAILED DESCRIPTION

Figure 1:
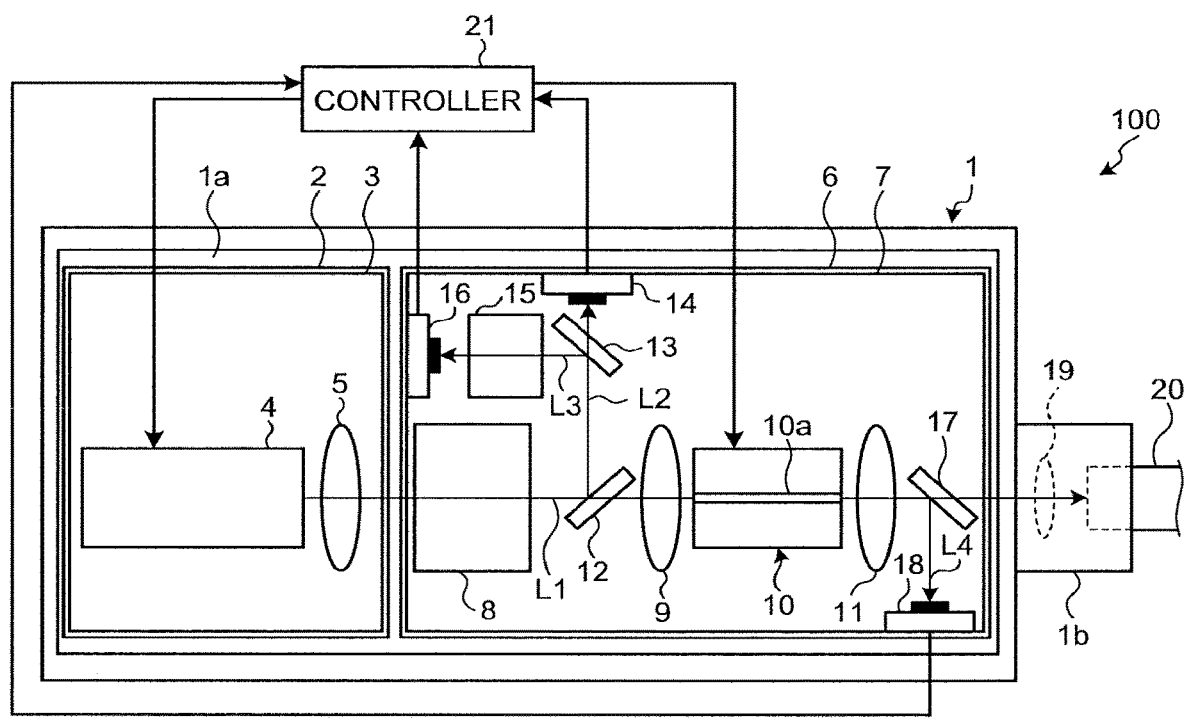
FIG. 1 is a schematic diagram of a configuration of a wavelength-tunable laser device according to an embodiment.

An embodiment of the present disclosure will be described below with reference to the drawings. The embodiment does not limit the disclosure. In the illustrations of the drawings, the same or corresponding components are denoted with the same reference numbers as appropriate. The drawings are schematic and it is necessary to note that the relationship in size among components, the ratio of the components, etc., may be different from actual ones. The mutual relationship in size or ratio may differ among the drawings. In the drawings, x, y and Z coordinate axes are represented as appropriate and directions will be described using the x, y and Z coordinate axes.

Embodiment

FIG. 1 is a schematic diagram of a configuration of a wavelength-tunable laser device according to an embodiment. A wavelength-tunable laser device 100 is realized as a module and includes a temperature adjusting device 2, a support member 3, a wavelength-tunable laser 4 serving as a wavelength-tunable laser device, a collimator lens 5, a temperature adjusting device 6, a support member 7, an optical isolator 8, a condenser lens 9, a semiconductor optical amplifier 10, a collimator lens 11, beam splitters 12 and 13, a power monitoring photo diode (PD) 14 serving as a light intensity variation detection unit, an etalon filter 15, a wavelength monitoring PD 16, a beam splitter 17, a power monitoring PD 18, a condenser lens 19, and an end portion of an optical fiber 20, all of which are housed in a casing 1. The module will be referred to as a wavelength-tunable laser module, when appropriate. The wavelength-tunable laser device 100 further includes a controller 21 that controls operations of the wavelength-tunable laser module.

The casing 1 includes a bottom board 1a, a side wall, and a top cover. The top cover is not illustrated in FIG. 1 for the sake of explanation. A holder 1b is provided on an outer surface of a side wall on the right side in FIG. 1. The holder 1b houses the condenser lens 19. Additionally, one end of the optical fiber 20 is inserted into the holder 1b and fixed therein. The casing 1 is sealed such that the inside of the casing is airtight. The bottom board 1a is formed of a material whose thermal conductivity is high, such as copper-tungsten (CuW). Other part of the casing 1 is formed of a material whose thermal expansion coefficient is lower, such as Kovar (registered trademark).

The temperature adjusting device 2 is, for example, a Peltier device. The temperature adjusting device 2 is placed on the bottom board 1a in the casing 1 and cool the wavelength-tunable laser 4 thereby to adjust a temperature of the wavelength-tunable laser 4 with electric current supplied thereto.

The support member 3 is placed on the temperature adjusting device 2. On the support member 3, the wavelength-tunable laser 4 and the collimator lens 5 are placed. The support member 3 is formed of a material whose thermal conductivity is high, such as aluminum nitride (AlN). The wavelength-tunable laser 4 is placed on the support member 3 placed on the temperature adjusting device 2.

The wavelength-tunable laser 4 is, for example, a wavelength-tunable laser using, for example, Vernier effect, and configuration examples of the wavelength-tunable laser 4 will be described in detail below. The wavelength-tunable laser 4 is controlled by the controller 21 and thus outputs the laser light L1. The wavelength of the laser light L1 is a wavelength within a wavelength band used for optical communication (for example, 1520 nm to 1620 nm).

The collimator lens 5 is placed on the support member 3 and is arranged to face a laser light emitting end of the wavelength-tunable laser 4 (or on the front side of the wavelength-tunable laser 4). The collimator lens 5 converts the laser light L1 from the wavelength-tunable laser 4 into parallel light.

The temperature adjusting device 6 is placed on the bottom board 1a in the casing 1 and is placed in front of the wavelength-tunable laser 4. The temperature adjusting device 6 is, for example, a Peltier device. The temperature adjusting device 6 adjusts a temperature of each element placed thereon with an electric current supplied thereto.

The support member 7 is placed on the temperature adjusting device 6. The support member 7 is formed of a material whose thermal conductivity is high. On the support member 7, the optical isolator 8, the condenser lens 9, the semiconductor optical amplifier 10, the collimator lens 11, the beam splitters 12 and 13, the power monitoring PD 14 serving as the light intensity variation detection unit, the etalon filter 15, the wavelength monitoring PD 16, the beam splitter 17, and the power monitoring PD 18 is placed. The temperature of each element is adjusted by the temperature adjusting device 6.

The optical isolator 8 is arranged between the wavelength-tunable laser 4 and the semiconductor optical amplifier 10. The optical isolator 8 transmits the laser light L1 that is input from the left side to the right side in FIG. 1 and prevents transmission of light from the right side to the left side in FIG. 1. Accordingly, return light (reflected light and amplified spontaneous emission (ASE) that is generated by the semiconductor optical amplifier 10) is prevented from entering the wavelength-tunable laser 4. This contributes to stable operations of the wavelength-tunable laser 4 and contributes to narrowing the line width of the laser light L1.

The condenser lens 9 causes the laser light L1, which has been rendered by the collimator lens 5 into parallel light and passes through the optical isolator 8, to be concentrated and enter the semiconductor optical amplifier 10.

The semiconductor optical amplifier 10 is provided separately from the wavelength-tunable laser 4. The semiconductor optical amplifier 10 includes an optical amplifier 10a, which is an optical waveguide having a striped embedded mesa structure containing an active layer. The semiconductor optical amplifier 10 optically amplifies the laser light L1 that enters the optical amplifier 10a and outputs the amplified laser light L1. Electric power is supplied to the semiconductor optical amplifier 10 from the controller 21, and optically amplifies the laser light L1 to a desired light intensity.

The collimator lens 11 renders the amplified laser light L1 output from the semiconductor optical amplifier 10 into parallel light. The condenser lens 19 concentrates and optically couples the laser light L1 that has been rendered by the collimator lens 11 into parallel light to the optical fiber 20. The optical fiber 20 transmits the laser light L1 to a given device, or the like.

The beam splitter 12 is arranged between the optical isolator 8 and the condenser lens 9. The beam splitter 12 is, for example, a half mirror and transmits a most part of the laser light L1 having passed through the optical isolator 8 to cause the most part of the laser light L1 to enter the condenser lens 9, and reflects a rest part of the laser light L1, as laser light L2, to the power monitoring PD 14. The beam splitter 13 is, for example, a half mirror and reflects part of the laser light L2, as laser light L3, to the etalon filter 15.

The power monitoring PD 14 detects an intensity of the laser light L2 and outputs an electric signal corresponding to the detected intensity to the controller 21.

The etalon filter 15 has cyclic transmission characteristics with respect to wavelengths (transmission wavelength characteristics) and selectively transmits the laser light L3 reflected by the beam splitter 13 at a transmissivity corresponding to the transmission wavelength characteristics and causes the transmitted laser light L3 to enter the wavelength monitoring PD 16. The cycle of transmission wavelength characteristics of the etalon filter 15 is, for example, 50 GHz, 33.3 GHz, and 25 GHz, or the like in terms of an optical frequency.

The wavelength monitoring PD 16 detects the laser light L3 that has transmitted through the etalon filter 15, and outputs an electric signal corresponding to an intensity of the detected laser light L3 to the controller 21.

The intensities of the laser light L2 and the laser light L3 that are detected by the power monitoring PD 14 and the wavelength monitoring PD 16, respectively, are used for wavelength locking control performed by the controller 21 (control performed such that the laser light L1 output from the wavelength-tunable laser 4 has a desired wavelength).

Specifically, in wavelength locking control, the controller 21 performs control to change the drive current and temperature of the wavelength-tunable laser 4 such that the ratio of the intensity of the laser light L2 detected by the power monitoring PD 14 and the intensity of the laser light L3 that has transmitted through the etalon filter 15 and is detected by the wavelength monitoring PD 16 is a ratio at which the laser light L1 has a desired intensity and a desired wavelength. Accordingly, it is possible to control the wavelength of the laser light L1 at a desired wavelength (locking wavelength). In this manner, the beam splitters 12 and 13, the power monitoring PD 14, the etalon filter 15, and the wavelength monitoring PD 16 function as a wavelength monitoring mechanism that monitors changes in wavelength of the laser light L1.

The beam splitter 17 reflects, as laser light L4, part of the laser light L1, which has been optically amplified by the semiconductor optical amplifier 10 and output from the semiconductor optical amplifier 10. The power monitoring PD 18 serving as a light intensity detector detects the laser light L4 and outputs an electric signal corresponding to an intensity of the detected laser light L4 to the controller 21. The controller 21 performs feedback control (output constant control) on the semiconductor optical amplifier 10 based on the intensity of the laser light L4 that is detected by the power monitoring PD 18. Specifically, the controller 21 performs feedback control by controlling the power supplied to the semiconductor optical amplifier 10 based on the intensity of the laser light L4 such that the laser light L1 has a desired intensity.

The controller 21 includes drivers that drive the wavelength-tunable laser 4 and the semiconductor optical amplifier 10, respectively, an arithmetic operator that performs various arithmetic operations to control the drivers, a storage, such as a ROM, in which various programs, data, used by the arithmetic operator to perform the arithmetic operations, and a storage, such as a RAM, used to store an operation space for the arithmetic processor to perform the arithmetic operations and results of the arithmetic operations performed by the arithmetic operator. The controller 21 includes functions as a semiconductor optical amplifier feedback control unit that performs feedback control on the semiconductor optical amplifier 10 and as a wavelength dithering generation unit and a wavelength dithering feedback control unit, which will be described below.

Figure 2:
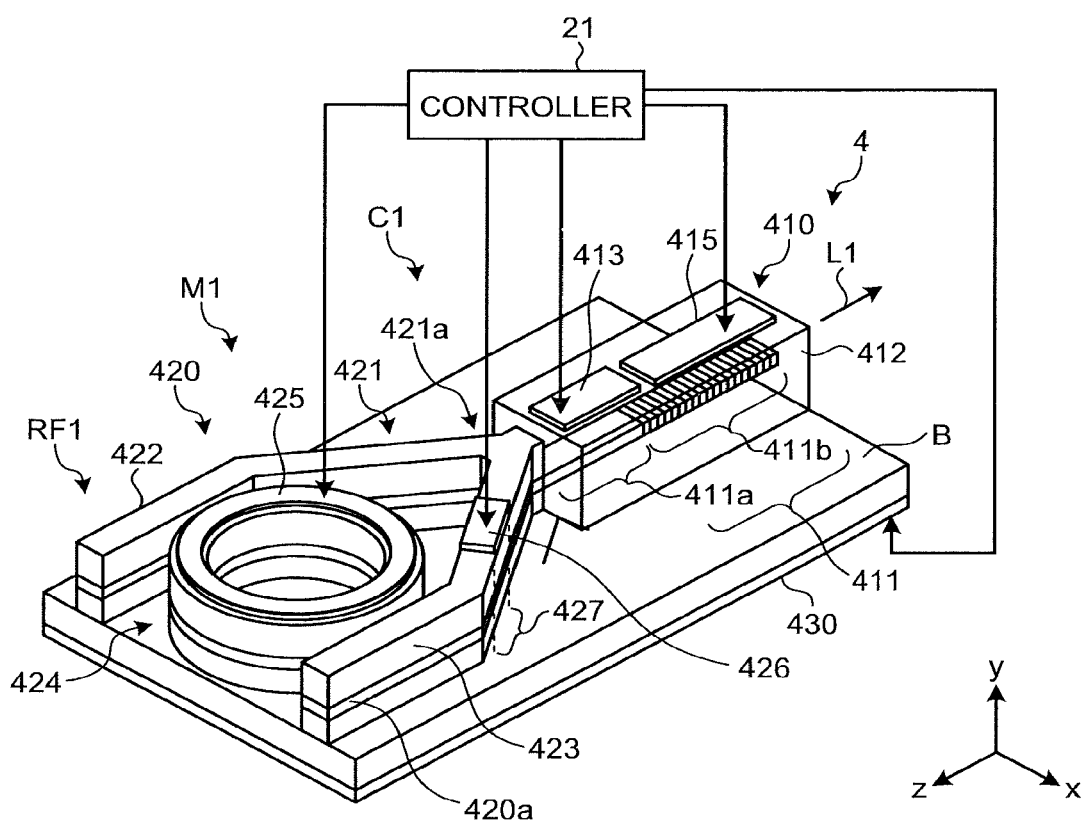
FIG. 2 is a schematic diagram of Configuration Example 1 of the wavelength-tunable laser and a controller.

Configuration examples of the wavelength-tunable laser 4 and control on the wavelength-tunable laser 4 will be described. FIG. 2 is a schematic diagram of Configuration Example 1 of the wavelength-tunable laser 4 and the controller.

The wavelength-tunable laser 4 includes a first waveguide 410 and a second waveguide 420 that are formed on a common base B. The base B is formed of, for example, n-InP. An n-electrode 430 is formed on the back surface of the base B. The n-electrode 430 is formed of, for example, AuGeNi, and forms an Ohmic contact with the base B.

The first waveguide 410 includes a waveguide 411, a semiconductor layered part 412, a p-electrode 413, and a micro heater 415 formed of Ti. The first waveguide 410 has a buried waveguide configuration; and the waveguide 411 extends in a z direction in the semiconductor layered part 412. In the first waveguide 410, a gain part 411a and a Distributed Bragg Reflector (DBR) diffraction grating layer 411b serving as a wavelength selection element are arranged. The gain part 411a is an active layer having an optical confinement layer and a strained multiple quantum well (MQW) structure formed of InGaAsP. The diffraction grating layer 411b is formed of a sampling diffraction grating formed of InGaAsP and InP. The semiconductor layered part 412 is formed by layering InP semiconductor layers and serves as a cladding part for the waveguide 411.

The p-electrode 413 is arranged on the semiconductor layered part 412 and along the gain part 411a. A SiN protective coating to be described below is formed on the semiconductor layered part 412 and the p-electrode 413 contacts the semiconductor layered part 412 via an opening that is formed in the SiN protective coating. The micro heater 415 is arranged on the SiN protective coating of the semiconductor layered part 412 and along the diffraction grating layer 411b. The micro heater 415 is supplied with an electric current from the controller 21 and thus generates heat to heat the diffraction grating layer 411b. The controller 21 controls an amount of the electric current and accordingly the temperature of the diffraction grating layer 411b changes and the refractive index of the diffraction grating layer 411b changes.

The second waveguide 420 includes a bifurcation part 421, two arms 422 and 423, a ring waveguide 424, and a micro heater 425 formed of Ti.

The bifurcation part 421 is formed of a 1×2 bifurcated waveguide including a 1×2 multimode interference (MMI) waveguide 421a. Bifurcated ports of the MMI waveguide 421a are connected to the arms 422 and 423, respectively, and a single port of the MMI waveguide 421a is connected to the first waveguide 410. The arms 422 and 423 are merged at respective one ends by the MMI waveguide 421a, and optically coupled with the diffraction grating layer 411b.

Both of the arms 422 and 423 extend in the z direction and are arranged to have the ring waveguide 424 disposed therebetween. The arms 422 and 423 are close to the ring waveguide 424 and both of the arms 422 and 423 are optically coupled with the ring waveguide 424 by the same coupling coefficient K. The value of K is, for example, 0.2. The arms 422 and 423 and the ring waveguide 424 form a ring resonator filter RF1. The ring resonator filter RF1 and the bifurcation part 421 form a reflective mirror M1 serving as a wavelength selection element. The micro heater 425 is ring-shaped and is arranged on a SiN protective layer that is formed to cover the ring waveguide 424. The micro heater 425 is supplied with an electric current from the controller 21 and thus generates heat to heat the ring waveguide 424. The controller 21 controls an amount of the electric current and accordingly the temperature of the ring waveguide 424 changes and the refractive index of the ring waveguide 424 changes.

Each of the bifurcation part 421, the arms 422 and 423 and the ring waveguide 424 has a high-mesa waveguide configuration in which an optical waveguide layer 420a formed of InGaAsP is sandwiched by cladding layers formed of InP.

A micro heater 426 is arranged on part of the SiN protective layer of the arm 423. In the arm 423, an area under the micro heater 426 functions as a phase adjuster 427 serving as a phase adjusting element that changes the phase of light. The micro heater 426 is supplied with electric current from the controller 21 and thus generates heat to heat the phase adjuster 427. The controller 21 controls an amount of the electric current and accordingly the temperature of the phase adjuster 427 changes and the refractive index of the phase adjuster 427 changes.

The first waveguide 410 and the second waveguide 420 form an optical resonator C1 that is formed of the diffraction grating layer 411b and the reflective mirror M1 that are paired with and optically connected to each other. The gain part 411a and the phase adjuster 427 are arranged in the optical resonator C1.

Figure 3A:
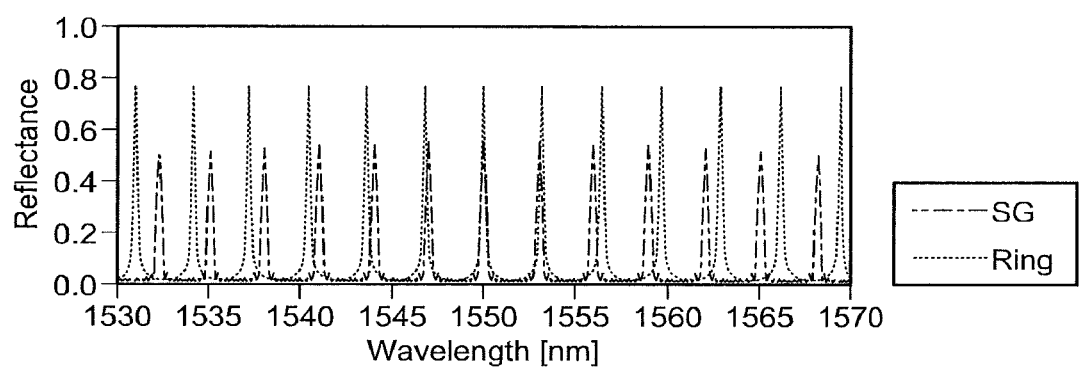
FIG. 3A is a diagram of a first comb-like reflectance spectrum and a second comb-like reflectance spectrum.
Figure 3B:
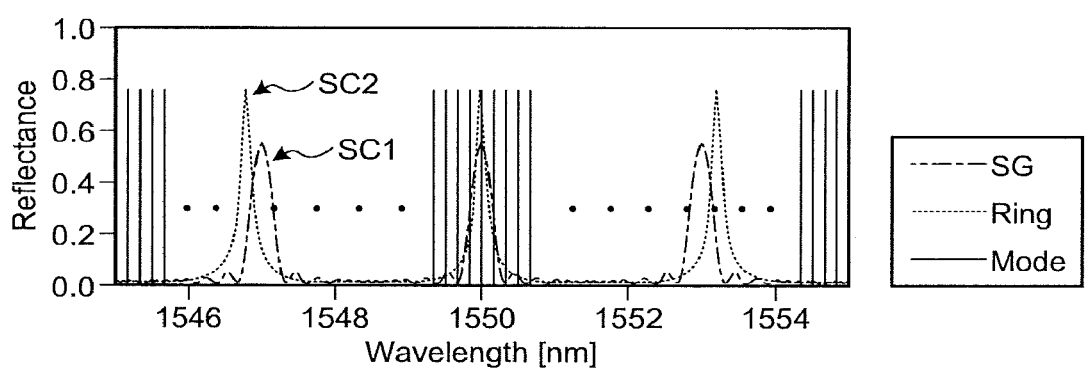
FIG. 3B is a diagram of the first comb-like reflectance spectrum, the second comb-like reflectance spectrum, and a resonator mode.

Reflection characteristics of the diffraction grating layer 411b and the ring resonator filter RF1 will be described using FIGS. 3A and 3B. The vertical axis in FIGS. 3A and 3B represents reflectance. As illustrated by a curve "SG" in FIG. 3A, the diffraction grating layer 411b generates, as a wavelength response spectrum, a first comb-like reflectance spectrum having reflection characteristics that are approximately cyclic at approximately given channel spacings. On the other hand, as illustrated by another curve "Ring" in FIG. 3A, the ring resonator filter RF1 generates a second comb-like reflection spectrum having reflection characteristics that are approximately cyclic at approximately given channel spacings. FIG. 3B is a diagram of the enlarged vicinity of 1550 nm of the reflection spectrum in FIG. 3A. In FIG. 3B, line segments "Mode" represent resonator mode of the optical resonator C1. The resonator mode exists in a wavelength range from 1530 nm to 1570 nm illustrated in FIG. 3A. As illustrated in FIGS. 3A and 3B, the second comb-like spectrum has a peak SC2 whose full width at half maximum is narrower than that of a peak SC1 of the first comb-like spectrum and has reflection characteristics that is approximately cyclic at channel spacings that are different from those of the first comb-like spectrum. Note that, it should be noted that, in consideration of chromatic dispersion of refractive index, strictly, spectrum components are not at equal channel spacings.

Characteristics of each of the comb-shaped reflectance spectrums will be exemplified. The channel spacing between peaks of the first comb-like reflectance spectrum (free spectrum range (FSR)) is 373 GHz when represented by frequency of light and the full width at half maximum of each peak is 43 GHz when represented by frequency of light. The channel spacing between peaks of the second comb-like reflectance spectrum (FSR) is 400 GHz when represented by frequency of light and the full width at half maximum of each peak is 25 GHz when represented by frequency of light. In other words, the full width at half maximum of each peak (25 GHz) of the second comb-like reflectance spectrum is narrower than that of each peak (43 GHz) of the first comb reflectance spectrum.

The peak of the second comb-like reflectance spectrum has a shape that precipitously changes with respect to wavelength and has a wavelength range where the secondary differential of reflectance with respect to wavelength takes a positive value on the shorter wavelength side and the longer wavelength side with respect to the peak. The peaks of the second comb-like reflectance spectrum have, for example, a shape of double exponential distribution (Laplace distribution). On the other hand, the peak of the first comb-like reflectance spectrum has a shape that changes more gently with respect to wavelength than in the peaks of the second comb-like reflectance spectrum and has a wavelength range where the secondary differential of reflectance with respect to wavelength takes a negative value on the shorter wavelength side and the longer wavelength side with than the peak. The peaks of the first comb reflectance spectrum have, for example, a Gaussian shape.

Figure 4:
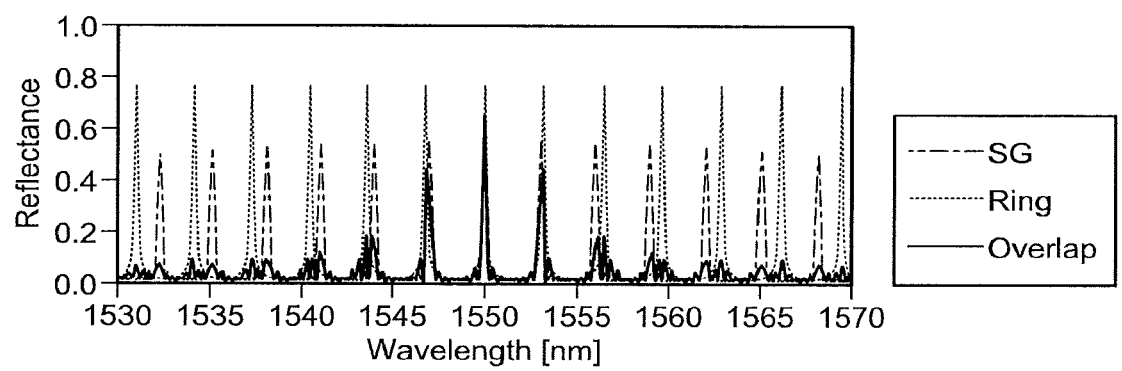

The wavelength-tunable laser 4 is configured such that, in order to realize laser emission, one of the peaks of the first comb-like reflectance spectrum and one of the peaks of the second comb-like reflectance spectrum can overlap on the wavelength axis. FIG. 4 is a diagram of the first comb-like reflectance spectrum, the second comb-like reflectance spectrum, and overlapping of the two. A curve "Overlap" represents overlapping between the spectrums. In the example illustrated in FIG. 4, the two spectrums overlap with each other to the greatest degree at the wavelength of 1550 nm.

Such overlapping is realized by heating the diffraction grating layer 411b with the micro heater 415 to change the refractive index of the diffraction grating layer 411b by thermooptic effect, so that the first comb-like reflectance spectrum is shifted along the wavelength axis, or heating the ring waveguide 424 with the micro heater 425 to change the refractive index of the ring waveguide 424, so that the second comb-like reflectance spectrum is shifted along the wavelength axis. Alternatively, both the diffraction grating layer 411b and the ring waveguide 424 may be heated with the micro heater 415 and the micro heater 425, respectively.

On the other hand, as partly illustrated in FIG. 3B, there exists the resonator mode due to the optical resonator C1 in the wavelength-tunable laser 4. In the wavelength-tunable laser 4, a cavity length (described below) of the optical resonator C1 is set such that a spacing of the resonator modes (longitudinal mode spacing) is 25 GHz or lower. Specifically, the cavity length of the optical resonator C1 is set to be 1800 µm or higher, according to which narrowing the linewidth of laser light to be emitted is expectable.

When the controller 21 supplies electric current from the p-electrode 413 through the n-electrode 430 thereby to inject carriers into the gain part 411a which then emits light, the wavelength-tunable laser 4 is configured to output the laser light L1 at a wavelength where a peak of the first comb-like reflectance spectrum serving as a spectrum component, a peak of the second comb-like reflectance spectrum serving as a spectrum component, and one resonator mode of the optical resonator C1 coincide with one another, for example, at 1550 nm. It is possible to finely adjust the wavelength of the resonator mode of the optical resonator C1 by heating the phase adjuster 427 with the micro heater 426 to change the refractive index of the phase adjuster 427 so that the wavelength of the resonator mode is shift along the wavelength axis. In other words, the phase adjuster 427 is part for positively controlling the optical path length of the optical resonator C1.

A method of selecting a laser emission wavelength in the wavelength-tunable laser 4 will be described. In the wavelength-tunable laser 4, a laser emission wavelength is selected using Vernier effect.

As illustrated in FIGS. 3A, 3B and 4, the FSRs of the first comb-like reflectance spectrum and the second comb-like reflectance spectrum are designed to be slightly different. When the FSR of the second comb-like reflectance spectrum having precipitous peaks is set relatively larger, the height of a overlapped peak (for example, at around 1547 nm) adjacent to 1550 nm where the height of the overlapped peak is the largest. Namely, lasing is inhibited at the wavelength adjacent to the wavelength where the overlapped peak becomes highest, and thus it is possible to increase a side mode suppression ratio.

A wavelength tunable range of the wavelength-tunable laser 4 is determined through a least common multiple of the FSRs by utilizing Vernier effect. When one of the peaks of the first comb-like spectrum and one of the peaks of the second comb-like spectrum are overlapped with each other and the reflectance is maximized at the wavelength where the peaks overlapped, lasing is caused. In other words, the Vernier effect of the diffraction grating layer 411b and the ring resonator filter RF1 determines a rough lasing wavelength (super mode). More precisely, the lasing wavelength is determined by overlapping of the wavelength of resonator mode and the super mode that is determined by a return path (cavity length) from the diffraction grating layer 411b back to the diffraction grating layer 411b sequentially via the bifurcation part 421, one of the arms 422 and 423 of the ring resonator filter RF1, the ring waveguide 424, the other one of the arms 422 and 423, and the bifurcation part 421. In other words, when one resonator mode of the optical resonator C1 coincides with the range where a peak of the first comb-like reflectance spectrum and a peak of the second comb-like reflectance spectrum are overlapped, lasing is caused at the wavelength of the coincided resonator mode. Namely, in the wavelength-tunable laser 4, wavelength tunable operations are performed by roughly adjusting the first comb-like reflectance spectrum and the second comb-like reflectance spectrum with the micro heater 415 for the diffraction grating layer 411b and the micro heater 425 for the resonator filter RF1, respectively, and by fine tuning the cavity length with the micro heater 426 for the phase adjuster 427.

In the state illustrated in FIGS. 3A and 3B (referred to as a first state), the first comb-like reflectance spectrum and the second comb-like reflectance spectrum overlap with each other to the greatest degree at the wavelength of 1550 nm (super mode). In the first state, the lasing wavelength is roughly adjusted at around 1550 nm. While keeping the first state, the resonator mode is fine turned by using the phase adjuster 427, so that lasing is caused at the wavelength of 1550 nm.

To change the lasing wavelength, only the diffraction grating layer 411b is heated with the micro heater 415 in a state where the ring resonator filter RF1 has been fine tuned. Accordingly, thermooptic effect increases the refractive index of the diffraction grating layer 411b, and the reflectance spectrum (first comb-like reflectance spectrum) of the diffraction grating layer 411b entirely shifts to the long wavelength side. As a result, the reflectance spectrum (first comb-like reflectance spectrum) of the diffraction grating layer 411b does not overlap with the peak of the reflectance spectrum of the ring resonator filter RF1 (second comb-like reflectance spectrum) at around 1500 nm anymore. Instead, the reflectance spectrum (first comb-like reflectance spectrum) of the diffraction grating layer 411b overlaps with another peak of the reflectance spectrum of the ring resonator filter RF1 (second comb-like reflectance spectrum) on the long-wave side (around 1556 nm), which is now referred to as a second mode. This realizes transition to another super mode. Furthermore, tuning the phase adjuster 427 to finely adjust the resonator mode makes it possible to realize laser emission at around 1556 nm. To change the lasing wavelength to the short-wave side, it suffices if tuning the diffraction grating layer 411b is fixed and only the ring resonator filter RF1 is heated with the micro heater 425 to entirely shift the comb-like reflectance spectrum of the ring resonator filter RF1 to the long-wave side.

In the wavelength-tunable laser device 100 according to the embodiment, the controller 21 performs the following control in order to enable one resonator mode of the optical resonator C1 to coincide with the range where a peak of the overlapped first comb-like spectrum and a peak of the second comb-like spectrum overlap.

In other words, the controller 21 generates a resonator mode wavelength dithering to modulate the resonator mode of the optical resonator C1 on the wavelength axis and, based on light intensity variation that is detected by the power monitoring PD 14 serving as a light intensity variation detection unit, performs feedback control on the resonator mode wavelength dithering.

Specifically, by using a phase adjustment signal for setting an intensity-modulated current as a current to be supplied from the controller 21 to cause the micro heater 426 to generate heat, the amount of heat to be generated by the micro heater 426 is controlled and accordingly the phase adjuster 427 is controlled to intensity-modulate the temperature and refractive index of the phase adjuster 427. Accordingly, the resonator mode is entirely modulated at a given wavelength interval on the wavelength axis as indicated by the arrow D1 in FIG. 5. This modulation (resonator mode wavelength dithering) varies the degree of overlapping between the range, where the peak the first comb-like reflectance spectrum and the peak of the second comb-like reflectance spectrum overlap with each other, and the resonator mode of the optical resonator C1. Accordingly the intensity of the laser light L1 output from the wavelength-tunable laser 4 varies. The light intensity variation is detected by the power monitoring PD 14. The controller 21 performs feedback control on the amplitude of modulation of the resonator mode wavelength dithering such that the detected amount of variation in light intensity variation is small and the light intensity is high. In other words, by controlling the phase adjuster 427 using the phase adjustment signal, feedback control on the resonator mode wavelength dithering is performed. Such feedback control is, for example, kept performed such that the state where the amount of variation in light intensity variation to be detected is within a setting value range and the light intensity is within a setting value range is maintained.

In general, the semiconductor optical amplifier 10 is operated in a state where the gain is saturated and thus variation in intensity of the laser light L1 is attenuated by the semiconductor optical amplifier 10. This makes it difficult to detect light intensity variation serving as response to the resonator mode wavelength dithering in the laser light L1 that is amplified by the semiconductor optical amplifier 10. Particularly, as in the wavelength-tunable laser device 100, when the semiconductor optical amplifier 10 is controlled for constant output, the light intensity variation caused by the resonator mode wavelength dithering is affected by the constant output control and thus is further attenuated, which makes the detection difficult.

Figure 5:
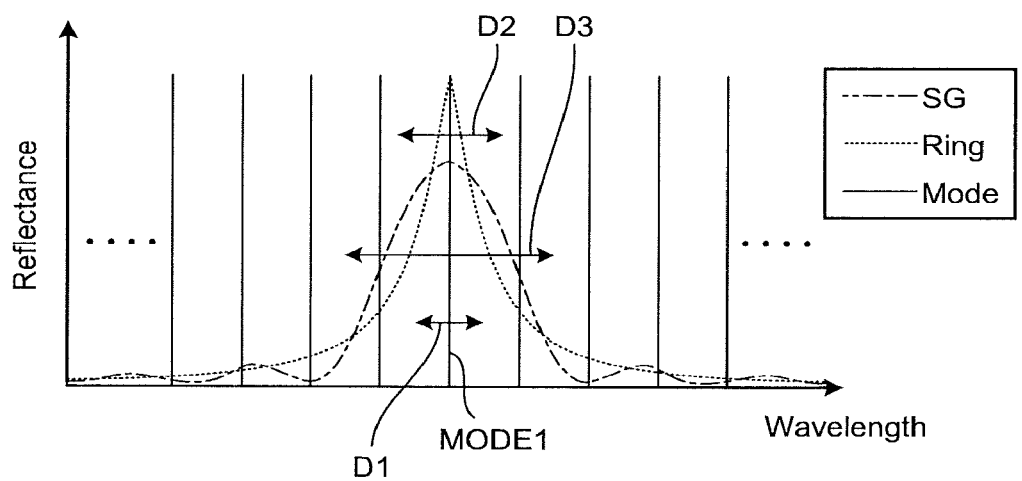
FIG. 5 is a diagram of overlapping of the first comb-like reflectance spectrum, the second comb-like reflectance spectrum, and a resonator mode and a wavelength dithering.

However, in the wavelength-tunable laser device 100, the power monitoring PD 14 is configured to detect variation in intensity of the laser light L1 before being input to the semiconductor optical amplifier 10 after output from the wavelength-tunable laser 4 and thus original light intensity variation serving as response to the resonator mode wavelength dithering is detected easily without effect of gain saturation and the constant output control. As a result, it is possible to more accurately perform control to cause a resonator mode of the optical resonator C1 to move to and coincide with the range where peaks of the two comb-like reflectance spectrums overlap within a given wavelength band by the resonator mode wavelength dithering. Particularly, peaks of the second comb-like reflectance spectrum have a shape that precipitously changes with respect to wavelength and thus light intensity variation serving as response to the resonator mode wavelength dithering increases. This makes it easier to accurately cause a resonator mode of the optical resonator C1 to coincide with the range where corresponding peaks of the two comb-like reflectance spectrums are overlapped. FIG. 5 illustrates the state where the resonator mode MODE1 coincides with the range where corresponding peaks of the two comb-like reflectance spectrums are overlapped.

The optical isolator 8 reduces effect of return light on light intensity variation serving as response to the resonator mode wavelength dithering and enables more accurate control. Furthermore, it is possible to more accurately perform control to cause resonator modes of the optical resonator C1 to move to and coincide with the range where peaks of the two comb-like reflectance spectrums are overlapped, thereby making it easier to realize stable single-mode emission of the wavelength-tunable laser 4.

In the wavelength-tunable laser 4 of the wavelength-tunable laser device 100, the controller 21 may be configured to serve as a wavelength dithering generation unit and to generate a wavelength selection element wavelength dithering to modulate, on the wavelength axis, a wavelength response spectrum (comb-like reflectance spectrum) of at least one of the diffraction grating layer 411b and the reflective mirror M1 that serve as a plurality of wavelength selection element. In this case, the controller 21 generates a resonator mode wavelength dithering and a wavelength selection element wavelength dithering and, based on light intensity variation that is detected by the power monitoring PD 14 serving as the light intensity variation detection unit, performs feedback control on the resonator mode wavelength dithering and the wavelength selection element wavelength dithering.

A case where a wavelength selection element wavelength dithering for the reflective mirror M1 is generated will be described as an example. By using a reflectance spectrum adjustment signal for setting an intensity-modulated current for a current to be supplied from the controller 21 to cause the micro heater 425 to generate heat, an amount of heat to be generated by the micro heater 425 is controlled and accordingly the reflective mirror M1 is controlled to intensity-modulate the temperature and refractive index of the phase adjuster 427. Accordingly, the first comb-like reflectance spectrum is entirely modulated at a given wavelength width on the wavelength axis as indicated by the arrow D2 in FIG. 5. Note that the resonator mode is also entirely modulated at a given wavelength width on the wavelength axis as indicated by the arrow D1. The two types of modulation vary the degree of overlapping between the range, where a peak of the first comb-like reflectance spectrum and a peak of the second comb-like reflectance spectrum are overlapped with each other, and the resonator mode of the optical resonator C1. Accordingly the intensity of the laser light L1 that is output from the wavelength-tunable laser 4 varies. The light intensity variation is detected by the power monitoring PD 14. The controller 21 performs feedback control on the amplitude of modulation of the wavelength selection element wavelength dithering and the resonator mode wavelength dithering such that the detected amount of variation in light intensity variation is small and the light intensity is high. In other words, by controlling the phase adjuster 427 using the phase adjustment signal and controlling the reflective mirror M1 using the reflectance spectrum adjustment signal, feedback control on the wavelength selection element wavelength dithering and the resonator mode wavelength dithering is performed. Such feedback control is, for example, kept performed such that the mode where the state where the amount of variation in light intensity variation to be detected is at a set value or smaller and the light intensity is at a set value or higher is maintained.

Furthermore, when a wavelength selection element wavelength dithering for the diffraction grating layer 411b is generated, using a reflectance spectrum adjustment signal for setting an intensity-modulated current for a current to be supplied from the controller 21 to the micro heater 415, the amount of heat to be generated by the micro heater 415 is controlled and accordingly the diffraction grating layer 411b is controlled to intensity-modulate the temperature and refractive index of the diffraction grating layer 411b. Accordingly, the second comb-like reflectance spectrum is entirely modulated at a given wavelength interval on the wavelength axis as indicated by the arrow D3 in FIG. 5. The three types of modulation indicated by the arrows D1, D2 and D3 vary the degree of overlapping between the range, where a peak of the first comb-like reflectance spectrum and a peak of the second comb-like reflectance spectrum are overlapped with each other, and the resonator mode of the optical resonator C1. Accordingly the intensity of the laser light L1 that is output from the wavelength-tunable laser 4 varies. The controller 21 performs feedback control on the amplitude of modulation of the two types of dithering that are the wavelength selection element wavelength dithering and the resonator mode wavelength dithering such that the detected amount of variation in light intensity variation is small and the light intensity is high. Such feedback control is, for example, kept performed such that the state where the amount of variation in light intensity variation to be detected is at a set value or smaller and the light intensity is at a set value or higher is maintained.

Configuration Example 2 of Wavelength-Tunable Laser

Figure 6:
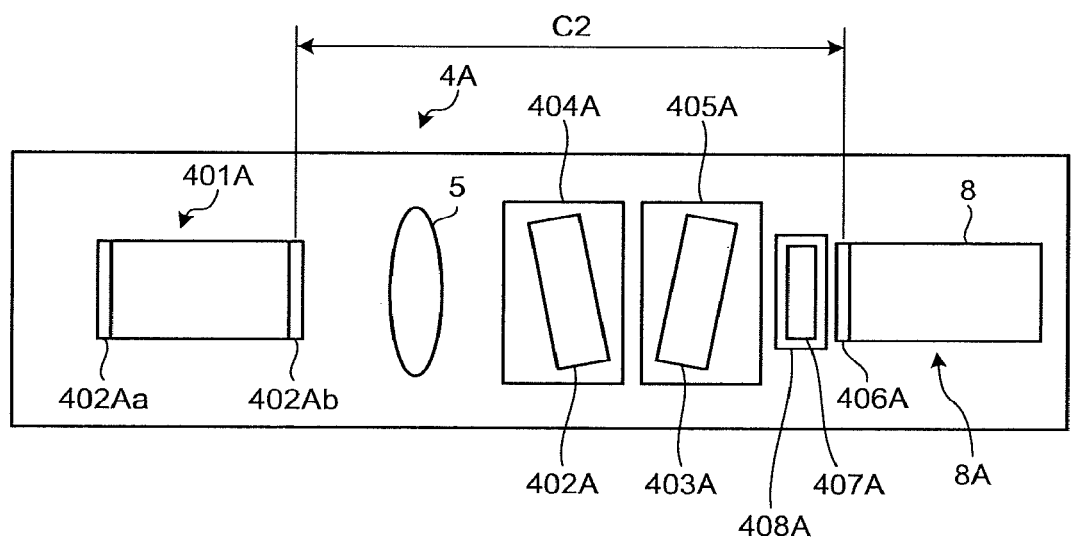
FIG. 6 is a schematic diagram of Configuration Example 2 of the wavelength-tunable laser.

In the wavelength-tunable laser device 100 of the embodiment, the wavelength-tunable laser 4 is replaceable by one of wavelength-tunable laser elements in various configurations. FIG. 6 is a schematic diagram of Configuration Example 2 of the wavelength-tunable laser. A wavelength-tunable laser 4A according to Configuration Example 2 includes a semiconductor amplifying device 401A, the collimator lens 5, etalon filters 402A and 403A, bases 404A and 405A on which the etalon filters 402A and 403A are placed, respectively, a reflective coating 406A that is formed on an end face of the optical isolator 8 of a reflective-coating optical isolator 8A, an optical element 407A that is transparent to the wavelength of laser light output from the semiconductor amplifying device 401A, and a heater base 408A on which the optical element 407A is placed. The wavelength-tunable laser 4A and the reflective-coating optical isolator 8A are replaceable with the wavelength-tunable laser 4 and the optical isolator 8 of the wavelength-tunable laser device 100. The reflective-coating optical isolator 8A may be placed on the support member 3.

In the semiconductor amplifying device 401A, a high reflective coating 402Aa whose reflectance is, for example, 90% or higher is formed on a back end face and an anti-reflective coating 402Ab is formed on a front end face. The semiconductor amplifying device 401A outputs laser light from the front end face. The semiconductor amplifying device 401A is, for example, a Fabry-Perot semiconductor laser device having a buried waveguide structure.

The etalon filters 402A and 403A are wavelength selection elements each of which generates, as a wavelength response spectrum, a transmission spectrum whose transmissivity changes approximately cyclically with respect to wavelength. The etalon filters 402A and 403A are arranged with their main surfaces being oblique at different angles with respect to the optical axis of the laser light output from the semiconductor amplifying device 401A. Thus, the etalon filters 402A and 403A have different cyclic changes in transmissivity of transmission spectrums. The etalon filters 402A and 403A transmit the laser light output from the semiconductor amplifying device 401A at the respective transmissivities in the wavelength range of the laser light.

The etalon filters 402A and 403A are provided with heaters that are supplied with electric currents from the controller 21 and thus generate heat to heat the etalon filters 402A and 403A, respectively. The controller 21 controls an amount of the electric current such that the temperature and refractive index of each of the etalon filters 402A and 403A are adjusted. This enables the transmission spectrums of the etalon filters 402A and 403A to entirely move along the wavelength axis.

The optical element 407A transmits the laser light that has transmitted through the etalon filters 402A and 403A. The heater base 408A is supplied with an electric current from the controller 21 and thus generates heat to heat the optical element 407A. The controller 21 controls an amount of the electric current such that each of the temperature and refractive index of the optical element 407A are adjusted. Thus, the optical element 407A functions as a phase adjusting element that changes the phase of light.

The reflective coating 406A is a low-reflective coating whose reflectance is around 10% to 30% and forms an optical resonator C2 of the wavelength-tunable laser 4A together with the high-reflective coating 402Aa of the semiconductor amplifying device 401A. The wavelength-tunable laser 4A has a so-called external resonator configuration in which the reflective coating 406A that is one of the reflective coatings forming the optical resonator C2 is outside the semiconductor amplifying device 401A and thus the cavity length can be increased.

In the wavelength-tunable laser 4A, the etalon filters 402A and 403A have different cycles at which the transmissivity of transmission spectrums change and the heaters enables entire movement of the respective transmission spectrums along the wavelength axis (in other words, the transmission spectrums are variable) and thus the wavelength-tunable laser 4A functions as a wavelength-tunable laser using the Vernier effect.

Furthermore, the controller 21 is able to perform the following control on the wavelength-tunable laser 4A in order to cause one resonator mode of the optical resonator C2 to coincide with a range where corresponding peaks of the two overlapped transmission spectrums are overlapped with each other.

In other words, the controller 21 generates a resonator mode wavelength dithering to modulate the resonator mode of the optical resonator C2 on the wavelength axis and, based on variation in intensity of light that is detected by the power monitoring PD 14 serving as the light intensity variation detection unit, performs feedback control on the resonator mode wavelength dithering. Specifically, by using a phase adjustment signal for setting an intensity-modulated current for a current to be supplied from the controller 21 to cause the heater of the heater base 408A to generate heat, the amount of heat to be generated by the heater is controlled and accordingly the optical element 407A is controlled to intensity-modulate the temperature and refractive index of the optical element 407A. The controller 21 performs feedback control on the amplitude of modulation of the resonator mode wavelength dithering such that the detected amount of variation in light intensity variation is small and the light intensity is high. In other words, by controlling the optical element 407A using the phase adjustment signal, feedback control on the resonator mode wavelength dithering is performed.

Also when the wavelength-tunable laser 4A is used in the wavelength-tunable laser device 100, the resonator mode wavelength dithering makes it possible to more accurately perform control to cause one resonator mode of the optical resonator C2 to move to and coincide with the range where corresponding peaks of the two transmission spectrums in a given wavelength band are overlapped with each other. This makes it easier to realize stable single-mode emission and accurately control the wavelength of laser light.

In the wavelength-tunable laser 4A, the controller 21 may be configured to further generate a wavelength selection element wavelength dithering to modulate a transmission spectrum of at least one of the etalon filters 402A and 403A on the wavelength axis. In this case, the controller 21 generates a resonator mode wavelength dithering and a wavelength selection element wavelength dithering and, based on light intensity variation that is detected by the power monitoring PD 14 serving as the light intensity variation detection unit, performs feedback control on the resonator mode wavelength dithering and the wavelength selection element wavelength dithering.

A case where the wavelength selection element wavelength dithering for the etalon filter 402A is generated will be described as an example. By using a transmission spectrum adjustment signal for setting an intensity-modulated current for a current to be supplied from the controller 21 to cause the heater, which is provided in the etalon filter 402A, to generate heat, an amount of heat to be generated by the heater is controlled. Accordingly, the etalon filter 402A is controlled to intensity-modulate the temperature and refractive index of the etalon filter 402A. Accordingly, the transmission spectrum of the etalon filter 402A is entirely modulated at a given wavelength width on the wavelength axis. Note that the resonator mode is also entirely modulated at a given wavelength width on the wavelength axis. The two types of modulation vary the degree of overlapping between the range, where peaks of the two transmission spectrums are overlapped with other, and the resonator mode of the optical resonator C2. Accordingly the intensity of the laser light that is output from the wavelength-tunable laser 4A varies. The controller 21 performs feedback control on the amplitudes of modulation of the wavelength selection element wavelength dithering and the resonator mode wavelength dithering such that the amount of variation in light intensity that is detected by the power monitoring PD 14 is small and the light intensity is high. In other words, by controlling the optical element 407A using the phase adjustment signal and controlling the etalon filter 402A using the transmission spectrum adjustment signal, feedback control on the wavelength selection element wavelength dithering and the resonator mode wavelength dithering is performed. Such feedback control is kept performed such that the state where the amount of variation in detected light intensity is at a set value or smaller and the light intensity is at a set value or larger is maintained.

Configuration Example 3 of Wavelength-Tunable Laser

Figure 7:
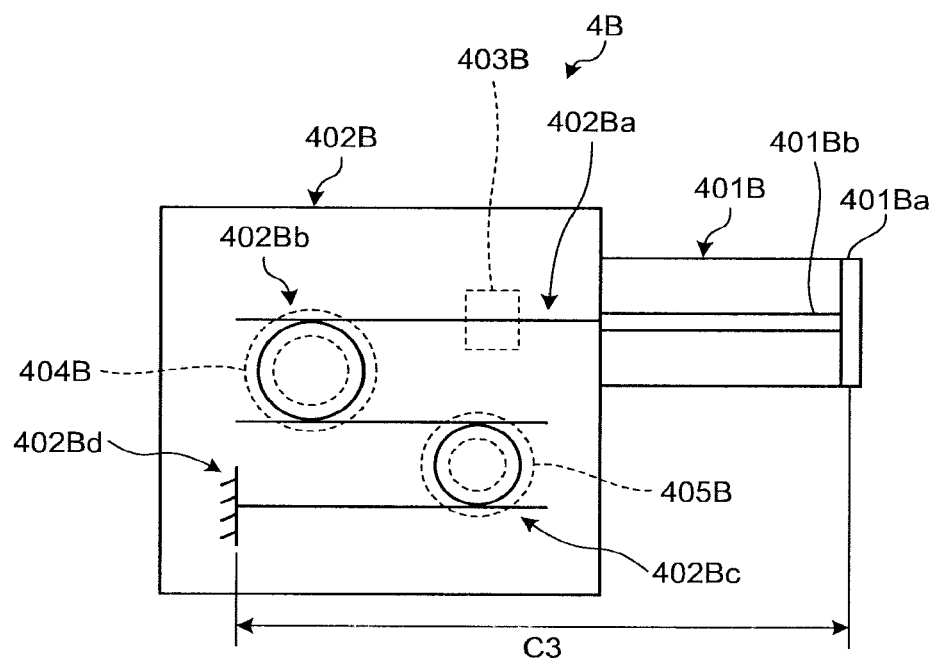
FIG. 7 is a schematic diagram of Configuration Example 3 of the wavelength-tunable laser.

FIG. 7 is a schematic diagram of Configuration Example 3 of the wavelength-tunable laser. A wavelength-tunable laser 4B according to Configuration Example 3 includes a semiconductor amplifying device 401B, a wavelength selection element unit 402B, and micro heaters 403B, 404B and 405B. The wavelength-tunable laser 4B is replaceable with the wavelength-tunable laser 4 of the wavelength-tunable laser device 100.

The wavelength selection element unit 402B is connected to a back end face of the semiconductor amplifying device 401B and a low-reflective coating 401Ba whose reflectance is, for example, around 10% to 30% is formed on a front end face of the semiconductor amplifying device 401B, and the semiconductor amplifying device 401B outputs laser light from the front end face. The semiconductor amplifying device 401B is, for example, a Fabry-Perot semiconductor laser device having a buried waveguide structure. The semiconductor amplifying device 401B includes an active layer 401Bb that is a waveguide.

The wavelength selection element unit 402B is, for example, formed of a silicon waveguide circuit that is used in silicon photonics. The wavelength selection element unit 402B includes a connection waveguide 402Ba, waveguide ring resonator filters 402Bb and 402Bc, and a reflector 402Bd. The connection waveguide 402Ba is optically connected to the active layer 401Bb of the semiconductor amplifying device 401B. Each of the ring resonator filters 402Bb and 402Bc includes two arms and a ring waveguide. One of the arms of the ring resonator filter 402Bb is optically connected to the connection waveguide 402Ba and the other arm is optically connected to one of the arms of the ring resonator filter 402Bb. The other arm of the ring resonator filter 402Bb is connected to the reflector 402Bd. Each of the ring resonator filters 402Bb and 402Bc is a wavelength selection element that generates, as a wavelength response spectrum, a comb-like transmission spectrum in which transmissivity changes approximately cyclically with respect to wavelength. The ring waveguides of the ring resonator filters 402Bb and 402Bc have diameters different from each other. Thus, the cycles of change in transmissivity of the comb-like transmission spectrums of the respective ring resonator filters 402Bb and 402Bc are different from each other. The ring resonator filters 402Bb and 402Bc transmit spontaneous emission light output from the semiconductor amplifying device 401B at respective transmissivities in the wavelength range of laser light.

The micro heater 403B is provided above the connection waveguide 402Ba. The micro heaters 404B and 405B are provided respectively above the ring waveguides of the ring resonator filters 402Bb and 402Bc. The micro heaters 403B, 404B, and 405B are each supplied with electric current from the controller 21 and thus generate heat to heat the connection waveguide 402Ba and the ring resonator filters 402Bb and 402Bc, respectively. The controller 21 controls an amount of the electric current supplied to the micro heaters 404B and 405B, and accordingly the temperature and refractive index of each of the ring resonator filters 402Bb and 402Bc changes. This enables entire movement of the comb-like transmission spectrums of the ring resonator filters 402Bb and 402Bc along the wavelength axis. The controller 21 controls an amount of the electric current supplied to the micro heater 403B and accordingly each of the temperature and refractive index of the connection waveguide 402Ba changes. Thus, the connection waveguide 402Ba functions as a phase adjusting element that changes the phase of light.

The reflector 402Bd has, for example, a reflectance of 90% or higher and forms the optical resonator C3 of the wavelength-tunable laser 4B together with the low-reflective coating 401Ba of the semiconductor amplifying device 401B. The wavelength-tunable laser 4B has an external resonator configuration and thus it is possible to increase the cavity length.

In the wavelength-tunable laser 4B, the cycles of change in transmissivity of the com-like transmission spectrums of the respective ring resonator filters 402Bb and 402Bc are different from each other and the micro heaters 404B and 405B allows the respective comb-like transmission spectrums to entirely move along the wavelength axis (in other words, the transmission spectrums are variable) and thus the wavelength-tunable laser 4B functions as a wavelength-tunable laser using the Vernier effect.

Furthermore, the controller 21 is able to perform the following control to cause a resonator mode of the optical resonator C3 to coincide with the region where corresponding peaks of the overlapped two comb-like transmission spectrums are overlapped with each other.

In other words, the controller 21 generates a resonator mode wavelength dithering to modulate the resonator mode of the optical resonator C3 on the wavelength axis and, based on light intensity variation that is detected by the power monitoring PD 14 serving as the light intensity variation detection unit, performs feedback control on the resonator mode wavelength dithering. Specifically, by using a phase adjustment signal for setting an intensity-modulated current for a current to be supplied from the controller 21 to cause the micro heater 403B to generate heat, the amount of heat to be generated by the micro heater 403B is controlled and accordingly the connection waveguide 402Ba is controlled to intensity-modulate the temperature and refractive index of the connection waveguide 402Ba. The controller 21 performs feedback control on the amplitude of modulation of the resonator mode wavelength dithering such that the amount of variation in the detected light intensity variation is small and the light intensity is high. In other words, by controlling the connection waveguide 402Ba using the phase adjustment signal, feedback control on the resonator mode wavelength dithering is performed.

When the wavelength-tunable laser 4B is used in the wavelength-tunable laser device 100, the resonator mode wavelength dithering makes it possible to more accurately perform control to cause one resonator modes of the optical resonator C3 to move to and coincide with the range where corresponding peaks of the two comb-like transmission spectrums in a given wavelength band are overlapped with each other. This makes it easier to realize stable single-mode emission and accurately control the wavelength of laser light.

In the wavelength-tunable laser 4B, the controller 21 may be configured to further generate a wavelength selection element wavelength dithering to modulate a transmission spectrum of at least one of the ring resonator filters 402Bb and 402Bc on the wavelength axis. In this case, the controller 21 generates a resonator mode wavelength dithering and a wavelength selection element wavelength dithering and, based on light intensity variation that is detected by the power monitoring PD 14 serving as the light intensity variation detection unit, performs feedback control on the resonator mode wavelength dithering and the wavelength selection element wavelength dithering.

A case where the wavelength selection element wavelength dithering for the ring resonator filter 402Bb is generated will be described as an example. By using a transmission spectrum adjustment signal for setting an intensity-modulated current for a current to be supplied from the controller 21 to cause the micro heater 404B to generate heat, the amount of heat to be generated by the micro heater 404B is controlled and accordingly the ring resonator filter 402Bb is controlled to intensity-modulate the temperature and refractive index of the ring resonator filter 402Bb. Accordingly, the comb-like transmission spectrum of the ring resonator filter 402Bb is entirely modulated at a given wavelength width on the wavelength axis. Note that the resonator mode is also entirely modulated at a given wavelength width on the wavelength axis. The two types of modulation vary the degree of overlapping between the range, where peaks of the two comb-like transmission spectrums are overlapped with other, and the resonator mode of the optical resonator C3. Accordingly the intensity of the laser light that is output from the wavelength-tunable laser 4B varies. The controller 21 performs feedback control on the amplitudes of modulation of the wavelength selection element wavelength dithering and the resonator mode wavelength dithering such that the amount of variation in light intensity that is detected by the power monitoring PD 14 is small and the light intensity is high. In other words, by controlling the connection waveguide 402Ba using the phase adjustment signal and controlling the ring resonator filter 402Bb using the transmission spectrum adjustment signal, feedback control on the wavelength selection element wavelength dithering and the resonator mode wavelength dithering is performed. Such feedback control is kept performed such that the state where the amount of variation in detected light intensity is at a set value or smaller and the light intensity is at a set value or larger is maintained.

In the wavelength-tunable laser according to the above-described embodiment, thermal optical effect implemented by the micro heaters is used in order to realize wavelength-tunable operations. Alternatively, carrier plasma effect by current injection may be used. In this case, current injection reduces the refractive index and accordingly the reflection spectrums entirely shift to the short-wave side and overlapping occurs between other peaks that are on the shorter wave side than that where the super mode is formed and accordingly it is possible to form a new super mode.

The embodiment produces an effect that it is possible to realize a wavelength-tunable laser device enabling easy realization of stable single-mode emission and easy accurate control on the wavelength of laser light.

Although the disclosure has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. A wavelength-tunable laser device comprising:
    a wavelength-tunable laser element including a plurality of wavelength selection elements in an optical resonator, wherein a wavelength response spectrum of at least one of the wavelength selection elements is variable;
    a semiconductor optical amplifier configured to receive laser light output from the wavelength-tunable laser element and amplify the received laser light;
    an optical isolator arranged between the wavelength-tunable laser element and the semiconductor optical amplifier;
    a light intensity variation detector configured to detect variation in intensity of the laser light output from the wavelength-tunable laser element before the laser light is input to the semiconductor optical amplifier;
    a wavelength dithering generation unit that generates a resonator mode wavelength dithering to modulate a resonator mode of the optical resonator on a wavelength axis;
    a wavelength dithering feedback control unit that performs, on the resonator mode wavelength dithering, feedback control in accordance with the variation in intensity that is detected by the light intensity variation detector;
    a light intensity detector that detects an intensity of the laser light output from the semiconductor optical amplifier; and
    a semiconductor optical amplifier feedback control unit that performs feedback control on the semiconductor optical amplifier in accordance with the intensity that is detected by the light intensity detector,
    wherein
    the semiconductor optical amplifier feedback control unit controls the semiconductor optical amplifier such that an output power of the semiconductor optical amplifier is kept constant, and
    the variation in intensity of the laser light is detected, before the laser light is input to the semiconductor optical amplifier, by the light intensity variation detector such that the variation in intensity is not attenuated by the resonator mode wavelength dithering generated by the wavelength dithering generation unit;
    wherein the wavelength-tunable laser element includes a phase adjusting element that is given a phase adjustment signal and changes a phase of light in the optical resonator, the wavelength dithering generation unit generates the resonator mode wavelength dithering by controlling the phase adjusting element according to the phase adjustment signal, and the wavelength dithering feedback control unit performs the feedback control on the resonator mode wavelength dithering by controlling the phase adjusting element.

2. The wavelength-tunable laser device according to claim 1, wherein the wavelength dithering generation unit generates a wavelength selection element wavelength dithering to modulate the wavelength response spectrum of at least one of the wavelength selection elements on the wavelength axis.

3. The wavelength-tunable laser device according to claim 2, wherein the wavelength dithering generation unit generates the wavelength selection element wavelength dithering by modulating a refractive index of the wavelength selection element.

4. The wavelength-tunable laser device according to claim 3, wherein the wavelength dithering generation unit generates the wavelength selection element wavelength dithering by modulating refractive indices of two of the wavelength selection elements.

5. The wavelength-tunable laser device according to claim 1, wherein the wavelength response spectrum is a reflectance spectrum and
    the resonator mode that is moved by the resonator mode wavelength dithering into a given wavelength range of the reflectance spectrum of the wavelength selection elements is caused to coincide with reflectance peaks within the given wavelength range.

6. The wavelength-tunable laser device according to claim 1, wherein the wavelength response spectrum is a transmission spectrum and
    the resonator mode that is moved by the resonator mode wavelength dithering into a given wavelength range of the transmission spectrum of the wavelength selection element is caused to coincide with transmission peaks within the given wavelength range.

7. The wavelength-tunable laser device according to claim 1, wherein, in a state where one peak of the response spectrum of one of the wavelength selection elements coincides with another peak of the response spectrum of another one of the wavelength selection elements on the wavelength axis, the resonator mode of the optical resonator is modulated on the wavelength axis.

8. The wavelength-tunable laser device according to claim 1, wherein the wavelength response spectrum is a reflectance spectrum and
    the wavelength selection elements that are paired with each other, among the wavelength selection elements, have different spacings of peaks in the reflectance spectrum.

9. The wavelength-tunable laser device according to claim 1, wherein the wavelength dithering generation unit modulates a refractive index of the phase adjusting element according to the phase adjustment signal.

10. The wavelength-tunable laser device according to claim 9, wherein the wavelength dithering generation unit modulates the refractive index of the phase adjusting element by controlling an amount of heat generate by a heater to heat the phase adjusting element according to the phase adjustment signal.

11. The wavelength-tunable laser device according to claim 1, wherein
the semiconductor optical amplifier feedback control unit controls the semiconductor optical amplifier such that an output power of the semiconductor optical amplifier is kept constant and a gain of the semiconductor optical amplifier is saturated.

12. The wavelength-tunable laser device according to claim 1, wherein
the semiconductor optical amplifier is provided separately from the wavelength-tunable laser element, and
the wavelength-tunable laser device further comprising a controller including
a semiconductor optical amplifier feedback control unit that controls the semiconductor optical amplifier provided separately from the wavelength-tunable laser element such that an output power of the semiconductor optical amplifier is kept constant, and
a wavelength dithering feedback control unit that performs, on the resonator mode wavelength dithering, feedback control in accordance with the variation in intensity of the laser light that is not attenuated.

13. The wavelength-tunable laser device according to claim 12, wherein
the semiconductor optical amplifier is provided separately from the wavelength-tunable laser element, and
the wavelength-tunable laser device further comprising a controller including
a semiconductor optical amplifier feedback control unit that controls the semiconductor optical amplifier provided separately from the wavelength-tunable laser element such that an output power of the semiconductor optical amplifier is kept constant, and
a wavelength dithering feedback control unit that performs, on the resonator mode wavelength dithering, feedback control in accordance with the variation in intensity of the laser light that is not attenuated.

* * * * *